United States Patent
Go et al.

(10) Patent No.: US 7,026,655 B2
(45) Date of Patent: Apr. 11, 2006

(54) LIGHT-TRANSMITTING MODULE CONTAINING AN DRIVING DEVICE IN A PACKAGE

(75) Inventors: Hisao Go, Yokohama (JP); Eiji Tsumura, Yokohama (JP); Akihiro Moto, Yokohama (JP); Kiyoshi Kato, Yokohama (JP); Toshiaki Kihara, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/882,656

(22) Filed: Jul. 2, 2004

(65) Prior Publication Data

US 2005/0025438 A1    Feb. 3, 2005

(30) Foreign Application Priority Data

Jul. 4, 2003   (JP) ............................. 2003-271125

(51) Int. Cl.
*H01L 29/41* (2006.01)
*G02B 6/36* (2006.01)

(52) U.S. Cl. ........................... 257/81; 257/80; 257/82; 257/83; 385/92; 372/50.1

(58) Field of Classification Search ............ 257/80–83; 385/92; 372/50.1; 398/138–139
See application file for complete search history.

(56) References Cited

U.S. PATENT DOCUMENTS 6,586,678 B1 *  7/2003  Rosenberg et al. ......... 174/52.5
6,618,408 B1     9/2003  Mader et al.
2002/0167977 A1  11/2002 Nakabayashi et al.
2004/0037334 A1  2/2004  Funada et al.

FOREIGN PATENT DOCUMENTS

| JP | 61-144924    | 7/1986  |
|----|--------------|---------|
| JP | 07-240565    | 9/1995  |
| JP | 2000-028872  | 1/2000  |
| JP | 2000-353846  | 12/2000 |
| JP | 2002-374028  | 12/2002 |
| JP | 2003-037329  | 2/2003  |
| JP | 2003-229629  | 8/2003  |
| JP | 2003-332667  | 11/2003 |

\* cited by examiner

*Primary Examiner*—Donghee Kang
(74) *Attorney, Agent, or Firm*—McDermott Will & Emery LLP

(57) ABSTRACT

A light-transmitting module of the present invention includes a light-emitting device such as a laser diode (LD), a transistor for shunting-drive the LD and a CAN type package with a base and an electrically conductive block. The LD and the transistor are mounted on a side of the block in side-by-side arrangement such that the LD substantially positions a center of the package. One of the current terminals of the transistor and one electrode of the LD are connected via the conductive block. The other of the current terminal of the transistor and the other of the electrodes of the LD are connected to one lead, while the control terminal of the transistor is connected to the other lead. Since the present module includes the transistor within the CAN type package, the size thereof may be miniaturized, and the quality of the optical output can be enhanced.

19 Claims, 15 Drawing Sheets

LIGHT-TRANSMITTING MODULE CONTAINING AN DRIVING DEVICE IN A PACKAGE

BACKGROUND OF THE INVENTION

1. Field of the Invention

The present invention relates to a light-transmitting module, in which includes an electronic device for driving the light-emitting device within the package.

2. Related Prior Art

In an optical transmitting module with a compact size, a CAN type package is widely used. The CAN type package contains a light-emitting device and a light-receiving device therein. The light-emitting device is electrically connected to a lead accompanied with the CAN type package, and is driven by a driver circuit provided outside thereof. The light-receiving device, which monitors light emitted from the light-emitting device, is also connected to another lead.

In such configuration that the driver circuit is provided outside of the module, the driving signal transmitted from the driver circuit to the module is deformed due to the impedance mismatching. That is, any transmission line intrinsically has transmission impedance, and when the transmission impedance does not match with an input impedance of the module, the signal transmitted in the transmission line may be deformed by a reflection at the input of the module, thereby degrading an optical output of the light-emitting device.

Moreover, when the driving signal is over giga-hertz (GHz), the light-emitting device, such as a semiconductor laser diode, must be supplied 50 mA or more as an AC current for modulating the laser diode. Such large current may cause an electro-magnetically-induced noise.

If a transistor for driving the light-emitting device is installed within the same package, in which the light-emitting device is enclosed, the transistor and the light-emitting device can be positioned immediately close to each other, which reduces the impedance mismatching effect. However, it is hard to install the transistor within the small sized package the conventional transmitting module generally uses.

Therefore, one object of the present invention is to provide an optical transmitting module in which an electronic active device for driving a light-emitting device is integrally enclosed within a same package with that the light-emitting device is installed.

SUMMARY OF THE INVENTION

According to one aspect of the present invention, a light-transmitting module comprises a light-emitting device, an electronic device, and a CAN type package. The light-emitting device may be a semiconductor laser diode (hereinafter denoted as LD), while the electronic device may be a transistor. The CAN type package, which encloses the LD and the transistor therein, includes an electrically conductive block. The LD and the transistor are mounted on a side of the block such that the LD is substantially positioned in a center of the CAN type package.

The transistor, having a pair of current terminals and a control terminal, is connected to the LD such that the LD is connected between the pair of current terminals, namely, the LD is driven by a shunting-drive configuration.

The CAN type package may include a base for supporting a plurality of leads. The control terminal of the transistor is connected to one of leads, one of current terminals of the transistor is directly connected to the block, and the other of current terminals of the transistor is connected to the other lead via one electrode of the LD.

The light-transmitting module of the present invention may further include a resistor between the control terminal and one of the current terminals of the transistor to match transmission impedance observed from outside of the module to the transmission impedance thereof. The resistor may be formed integrally in the transistor.

The module may further include an inductor connected, in one electrode thereof, to one of current terminals of the transistor and to one electrode of the LD. The other electrode of the inductor may be connected to one of leads. The inductor cuts off current induced noise into/out of the module. The inductor may be place on an edge plane, or on a side, of the lead.

The block may provide first and second regions on its side. The first region mounts the LD, while the second region mounts the transistor thereon. The first and second regions may form one plane. The height of the second region, measured from the base, may be greater than that of the first region. The other current terminal of the transistor may be directly connected to a portion in the second region sticking out of the first region.

The block may further comprise a third region in addition to the first and second regions. The second and third regions sandwich the first region therebetween such that the regions make respective angles to the first region to bare the leads from the base.

From FIG. 12 to FIG. 15 show steps of manufacturing the optical transmitting module according to the first embodiment of the invention.

DETAILED DESCRIPTION OF PREFERRED EMBODIMENTS

Next, preferred embodiments of the invention will be described in detail as referring to accompanying drawings. In specifications below and drawings, same elements will be referred by same numerals or same symbols without overlapping explanations.

(First Embodiment)

Figure 1:
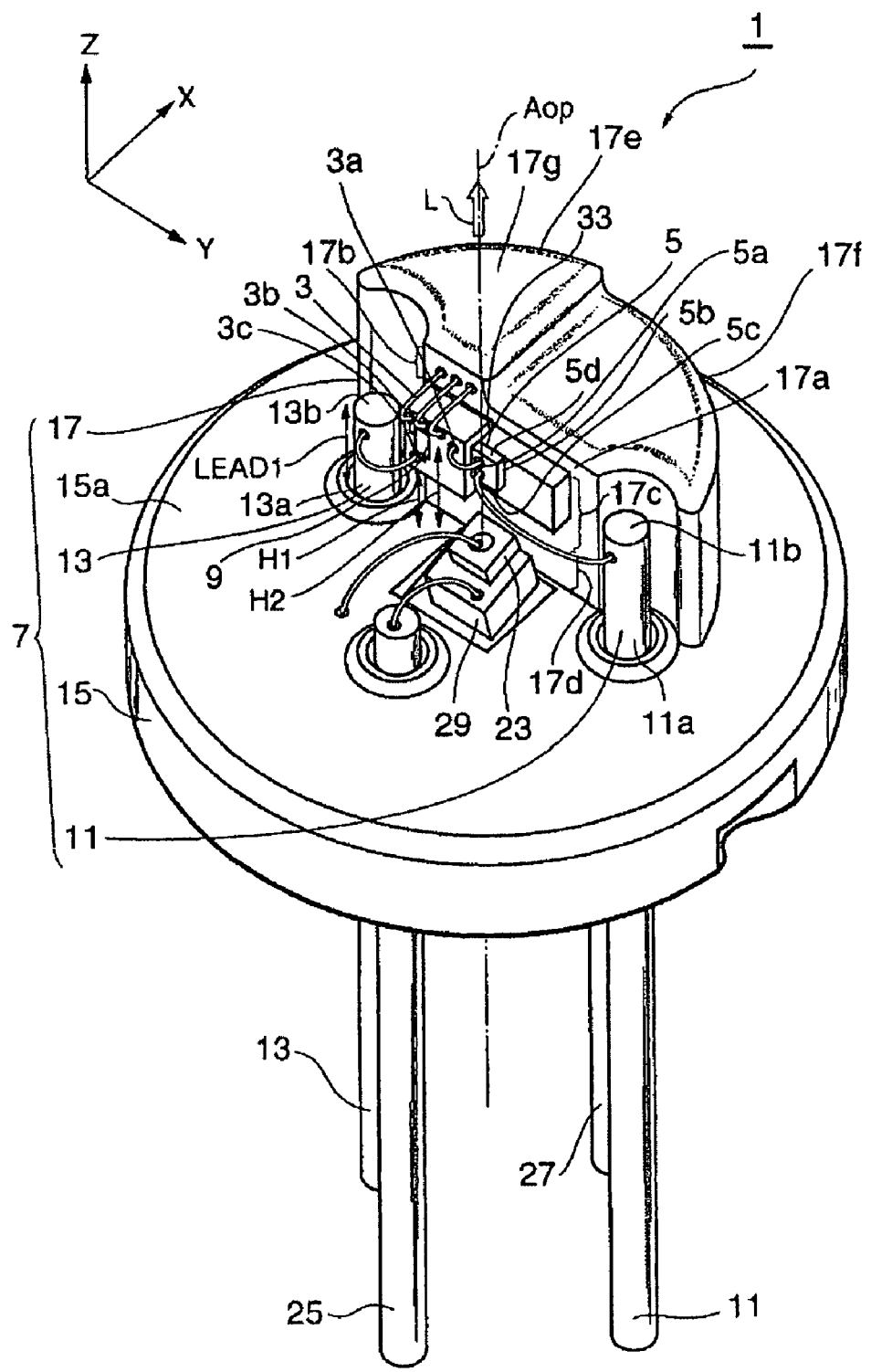
FIG. 1 is a perspective view showing an optical transmitting module according to the first embodiment of the present invention.
Figure 2:
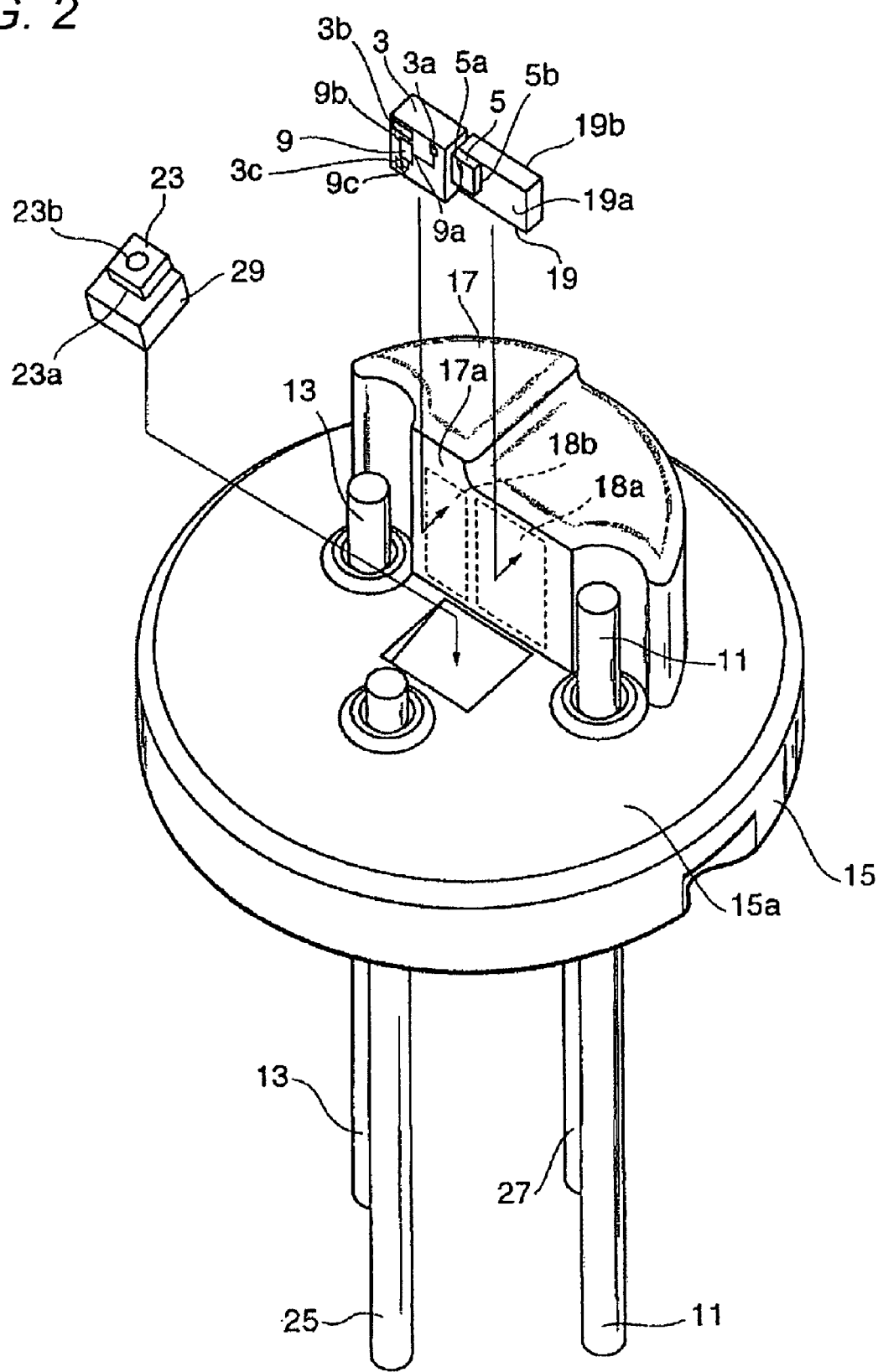
FIG. 2 is an exploded view showing the optical transmitting module.
Figure 3:
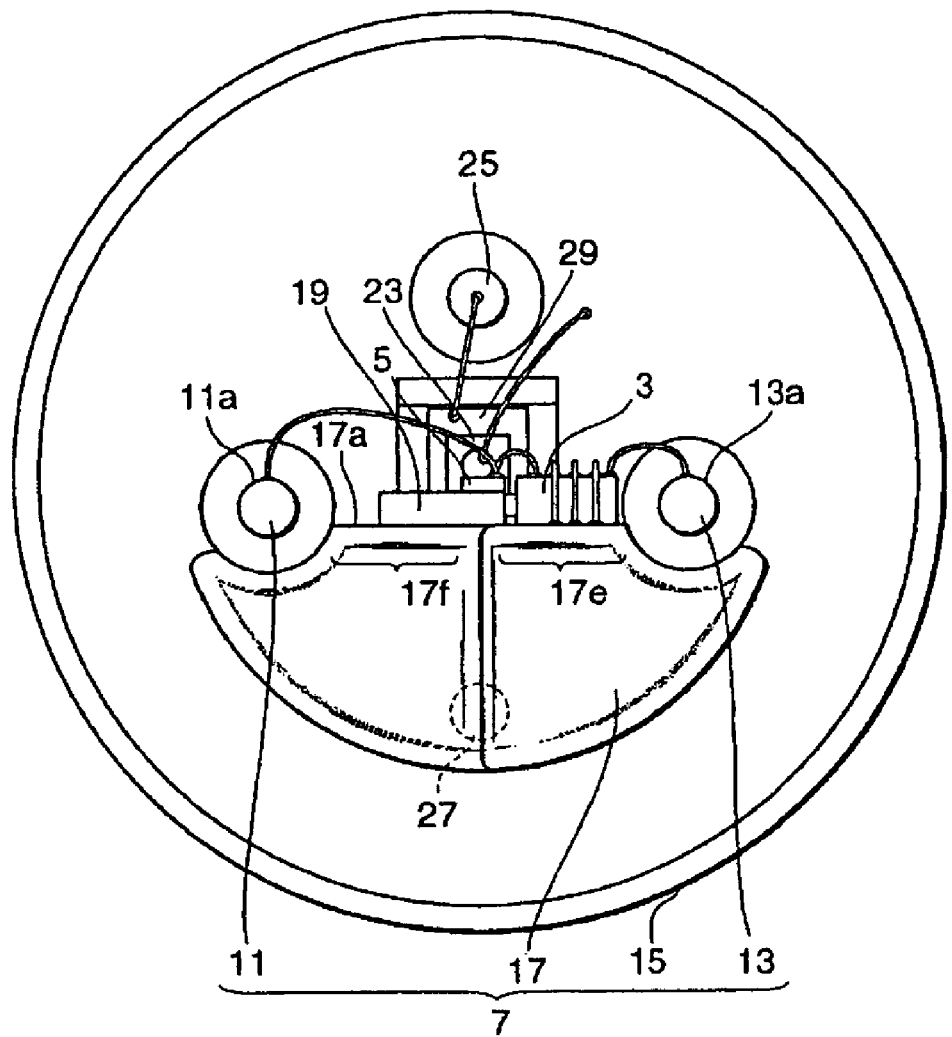
FIG. 3 is a plan view of the optical transmitting module.

FIG. 1 is a perspective view showing a light-transmitting module of the present invention, FIG. 2 is an exploded view, and FIG. 3 is a plan view of the light-transmitting module.

The light-transmitting module 1 includes an electronic device 3, which may contain a transistor 9, a semiconductor light-emitting device 5, typically a semiconductor laser diode, and stem 7. The electronic device 3 has at least three electrodes from 3a to 3c, two of which 3a and 3b are connected to a pair of current terminals 9a and 9b of the transistor 9, while the other electrode 3c is connected to a control terminal 9c of the transistor 9. The control terminal 9c of the transistor 9 controls a current flowing between the current terminals 9a and 9b. The semiconductor light-emitting device 5 includes two electrodes 5a and 5b, one of which 5a is connected to the electronic device 3, and the other electrode 5b faces and fixed to a conductive block on which the light-emitting device is mounted, thus the other electrode 5b thereof is electrically connected to the other of the current terminals 9b of the transistor 9 via the block 17.

The stem 7 includes first and second leads 11 and 13, a base 15, and the block 17 extruded from the base 15. The block 17 include a side 17a, the semiconductor light-emitting device 5 and the electronic device 3 are mounted thereon. One electrode 3a of the electronic device, which is connected to one current terminal 9a of the transistor 9, and one electrode 5a of the light-emitting device 5 are both connected to the first lead 11, while the other electrode 3c of the electronic device 3, which is connected to the control terminal 9c of the transistor 9 is connected to the second lead 13.

In the present light-transmitting module 1, not only the light-emitting device 5 but also the electronic device 3 are mounted on the side 17a of the block 17. Accordingly, the connection between the transistor 9 and the light-emitting device 5 may be performed in a short length, whereby the parasitic inductance due to the connection member, such as a bonding-wire, can be reduced. Further, heat generated by the transistor 9 and the light-emitting device 5 may be effectively dissipated via the block 17 and the base 15.

Referring to FIG. 2, the side 17a of the block 17 has first and second regions 18a and 18b. The light-emitting device 5 is mounted in the first region 18a, while the electronic device 3 is mounted on the second region 18b. The first and second regions 18a and 18b are included in the same plane, thus the devices 3 and 5 may be disposed immediately close to each other.

The base 15 and the block 17 are made of metal. The current terminal 9b of the transistor 9 and the other electrode 5b of the light-emitting device 5 are electrically connected to the block 17. That is, the electrode 3b of the electronic device 3 is wire-bonded to the block 17, while the other electrode 5b faces and fixed to the block 17. Since the transistor 9 and the light-emitting device 5 are thus connected via the metal block 17, no bonding wire is necessary to connect therebetween.

The semiconductor light-emitting device 5 is mounted on the side 17a of the block 17 via the heat sink 19. In the case that the heat sink 19 is made of electrically conductive material, the other electrode 5b of the light-emitting device 5 is connected to the block 17 via the heat sink 19. The heat sink may be made of copper tungsten (CuW), and has a primary surface 19a, the light-emitting device 5 is mounted thereon, and a secondary surface 19b opposing to the primary surface 19a. In the case that the light-emitting device 5 is a semiconductor laser diode with an n-type semiconductor substrate, the laser diode is mounted on the primary surface 19a such that the cathode thereof faces and fixed to the primary surface 19a of the heat sink 19, while the anode thereof is connected to the lead 11 with a bonding-wire.

The head sink 19 may be made of insulating material with good thermal conductivity, such as aluminum nitride. When the heat sink 19 is insulating, the primary surface 19a may provide a conductive patter thereon, which is electrically connected to another conductive pattern provided on the secondary surface 19b thereof. In another configuration, the conductive pattern of the primary surface 19a may be directly wire-bonded to the block 17.

An optical axis of the light-emitting device 5 substantially coincides with the center of the base 15. Accordingly, when uses a cap holding a lens at the center thereof, a building of the cap can be simplified without offsetting the lens from the center of the cap.

The electrode 3c of the electronic device 3, which is connected to the control terminal 9c of the transistor 9, is connected to the side surface 13a of the lead 13 with a bonding-wire. This configuration enables that, even placing if the electronic device 3 is mounted on the side 17a of the block in addition to the light-emitting device 5, both the electronic device 3 and the light-emitting device 5 can be easily wire-bonded to the lead 13.

Similar configuration for the wire-bonding is appeared in the side of the lead 11. That is, either the electrode 3a of the electronic device 3 or one of electrodes 5a of the light-emitting device 5 is connected to the side 11a of the lead 11 with a bonding-wire. In detail, one of electrodes 5a of the light-emitting device 5 is connected to the side 11a of the lead 11, while the electrode 3a of the electronic device 3 is connected to the electrode 5a of the light-emitting device 5. Thus, only connecting the end of the bonding-wire to the side 11a of the lead 11, not only the light-emitting device 5 but also the electronic device 3 can be electrically connected to the lead 11.

The light-transmitting module 1 may further include a light-receiving device 23, typically a semiconductor photo-diode. The light-receiving device 23, having an anode 23b and a cathode 23a, is mounted on the base 15, and optically coupled with the rear facet 5c of the light-emitting device 5. The light-receiving device 23 monitors output intensity of light emitted from the rear facet 5c of the light-emitting device 5, and generates a photo current corresponding to the output intensity. From the front facet 5d of the light-emitting device 5 is emitted light L as shown in FIG. 1.

The stem 7 further provides a third lead 25, the cathode of the light-receiving device 23 is connected thereto with a bonding-wire. While, the anode 23b of the light-receiving device 23 is directly wire-bonded to the base 15. The light-receiving device 23 is mounted on the base 15 via a sub-mount 29, which may be made of insulating material.

As shown in FIG. 3, the first lead 11, the light-emitting device 5, the electronic device 3, and the second lead 13 are arranged in an imaginary plane intersecting the base 15 and parallel to the side 17a of the block. Accordingly, the electrode 5a of the light-emitting device 5 can be connected to the lead 11 with the bonding-wire. Simultaneously, the electrode 3c of the electronic device 3 can be connected to the other lead 13 with the bonding-wire.

The side 17a of the block 17 provides a region 17b where the electrode 3b of the electronic device 3 is wire-bonded thereto by a plurality of bonding-wires. Three connections, namely, between the lead 11 and the electrode 5a of the light-emitting device 5, between the lead 13 and the electrode 3c of the electronic device 3, and between the electrode 3a of the electronic device 3 and the block 17, are performed by bonding-wires each extending to different directions.

In order to shorten the length of the bonding-wire connecting the lead 13 and the electrode 3c of the electronic device 3, the level LEAD1 measured from the base 15 to the tip 13b of the lead 13 is preferably greater than the level H1 also measured from the base 15 to the electrode 3c.

Also, in order to shorten the bonding-wire between the electrode 5a of the light-emitting device 5 and the electrode 3a of the electronic device 3, the level H2 to the electrode 3a is preferably comparable to that of the electrode 5a of the light-emitting device 5. The electronic device 3 is mounted on the side 17a of the block 17 such that both levels H1 and H2 substantially coincide with respect to each other, thus shortens the length of the bonding-wire connecting therebetween.

The length of the bonding-wire connecting the anode 5a of the light-emitting device 5 to the lead 11 is preferably longer than that of the bonding-wire connecting the lead 13 and the electronic device3. Parasitic inductance due to the bonding-wire to the lead 11 suppress the degradation of the signal The side surface 17a of the block 17 provides an open area 17d below the light-emitting device 5, where no devices are mounted thereon, to pass the light emitted from the rear facet 5c of the light-emitting device 5 to the light-receiving device 23.

The block 17 is divided into two portions 17e and 17f adjacent to each other. The height of the first portion 17e is greater than that of the second portion 17f, and extended region 17g in the first portion 17e from the second portion 17f provides the area 17b, to which a plurality of bonding-wires from the electronic device 3 is wire-bonded.

An outer diameter of the base 15 is about 5.6 mm, and the plurality of leads 11, 13, 25, and 27 are arranged on a circle having the same center as the base 15, the diameter of which is about 2.54 mm. The leads 11, 13, and 25 pass through bores, and secured to the base 15 with insulating material, such as seal glass, as a sealant. The last lead 27 is welded or blazed directly to the base 15.

Figure 4A:
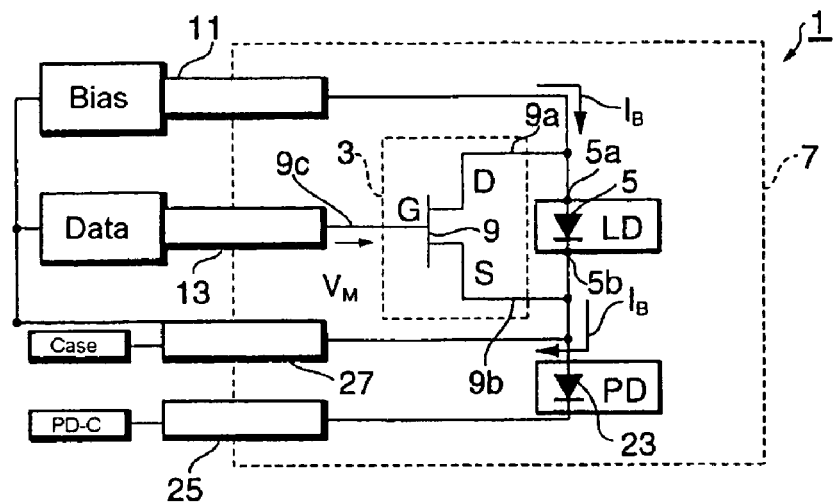
FIG. 4A is a circuit diagram of the optical transmitting module according to the first embodiment.

Next, a circuit diagram of the present light-transmitting module will be described. As shown in FIG. 4A, the transistor 9 may be a field effect transistor (FET) having source S, drain D, and gate G, and the light-emitting device may be the semiconductor laser diode (LD). The gate G is connected to the lead 13 via the control terminal 9c, the drain D is connected to the other lead 11 and to the anode of the LD via one of the current terminals 9a, and the source S is connected the cathode of the LD 5, respectively. This configuration is called as a shunting drive configuration. The bias current IB from the driving circuit BIAS provided outside of the module 1 is supplied to the lead 11, simultaneously, the driving signal $V_M$ is applied to the lead 13. The driving signal $V_M$ modulates the LD 5. That is, when the FET 9 is turned on by the driving signal $V_M$, the bias current $I_B$ flows into the FET9 rather than the LD 5. A limited forward current, under which the LD can not emit any light, flows into the LD in this condition. On the other hand, when the FET 9 is turned off by the driving signal $V_M$, the bias current $I_B$, which corresponds to the predetermined level to emit light, flows into the LD 5 rather than the FET 9.

When the electronic device 3 is installed on the same insulating substrate as the light-emitting device is to be mounted on in order to electrically isolate respective devices, the parasitic capacitance due to the insulating substrate may be increased. In the present embodiment, to avoid the increase of the parasitic capacitance, the electronic device is directly mounted on the electrically conductive block 17 with a conductive resin, while the LD 5 is mounted on the block 17 via the heat sink 19.

The FET 9 may be an enhancement type FET, in which the current flowing from the drain D to the source S can be cut off by equalizing the gate G and source S potentials, accordingly, a bias current only to emit light may be supplied to the LD. Moreover, in the enhancement type FET, a bias circuit for the gate is not necessary to cut off the FET.

(Second Embodiment)

Figure 4B:
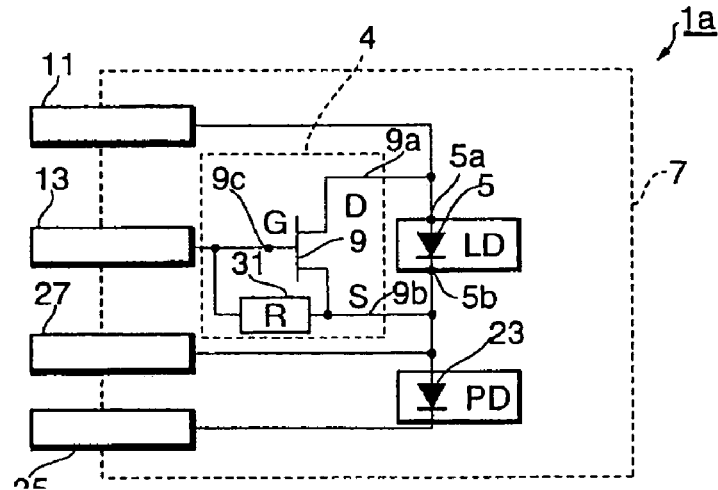
FIG. 4B is a circuit diagram of the second embodiment.
Figure 5:
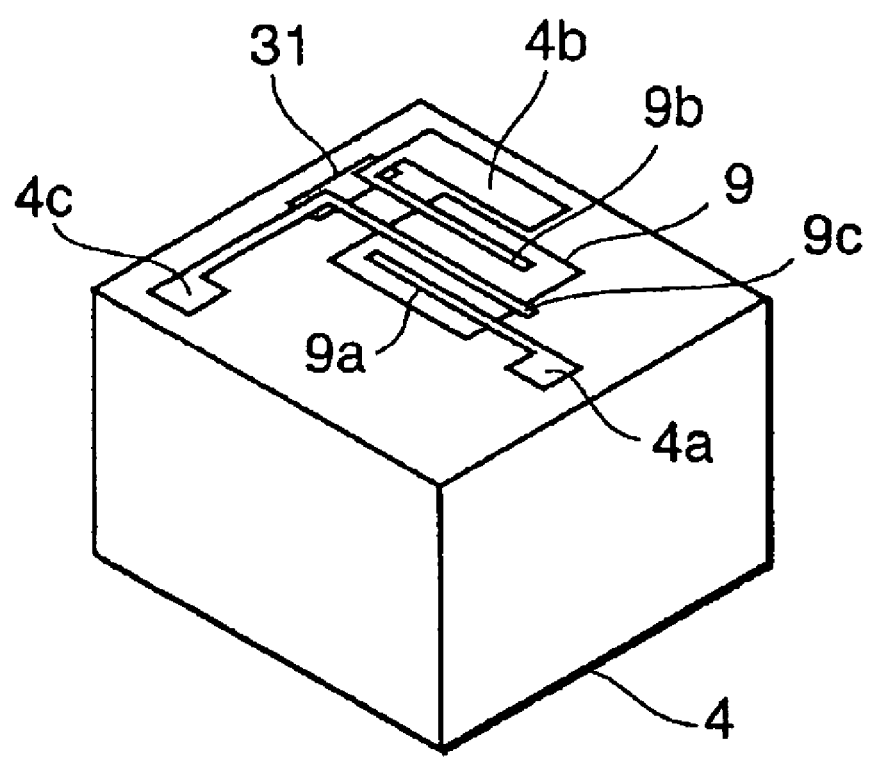
FIG. 5 shows an electronic device used in the optical transmission module according to the second embodiment of the invention.

FIG. 4B shows another circuit diagram of the light-transmitting module, and FIG. 5 shows an electronic device 4 used in the embodiment shown in FIG. 4B. The electronic device 4 includes a resistor 31 connected between the control terminal 9c and one of the current terminal 9b. In the light-transmitting module 1a, since the electronic device 4 integrates the resistor 31, an additional region to mount the resistor 31 is not necessary on the base 15 or on the block 17.

The electronic device 4 includes first to third electrodes 4a, 4b, and 4c. The first electrode 4a is connected to one of the current terminal 9a, the second electrode 4b is connected to the other current terminal 9b, and the third electrode 4c is connected to the control terminal 9c of the transistor 9.

The resistor 31 is provided between the control terminal 9c and the current terminal 9b, and the control terminal 9c is connected to the lead 13, accordingly, impedance observed from the lead 13 may be matched to the transmission impedance. Attenuation of the driving signal and degradation thereof due to the impedance mismatching may be reduced, thereby enhancing the quality of the output light.

(Third Embodiment)

Figure 4C:
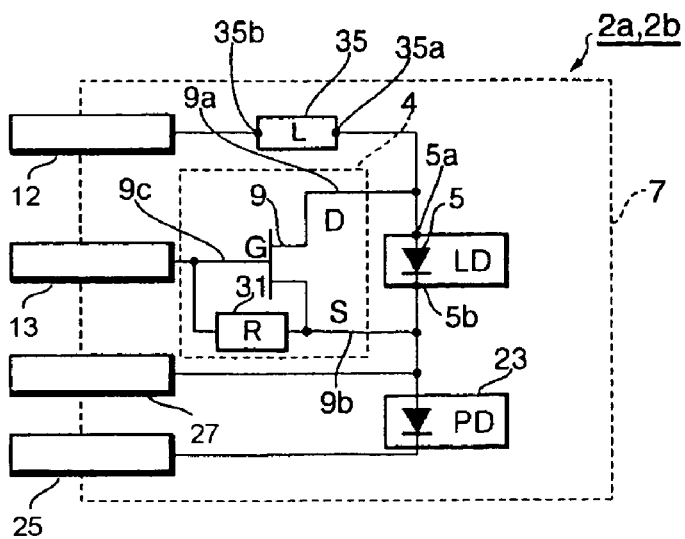
FIG. 4C is a circuit diagram of the third embodiment of the optical transmitting module.
Figure 6:
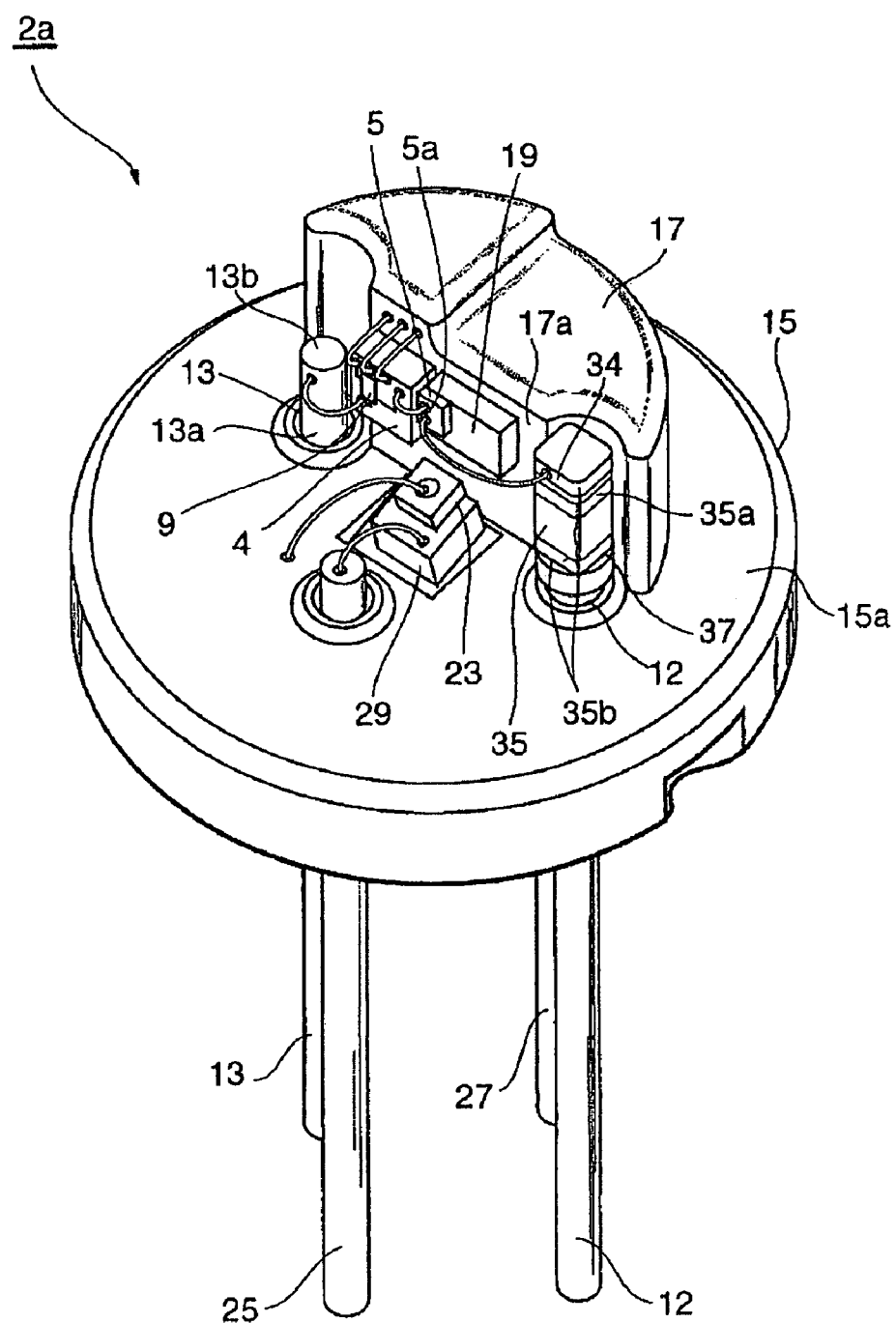
FIG. 6 is a perspective view of the optical transmitting module according to the third embodiment of the invention.
Figure 7:
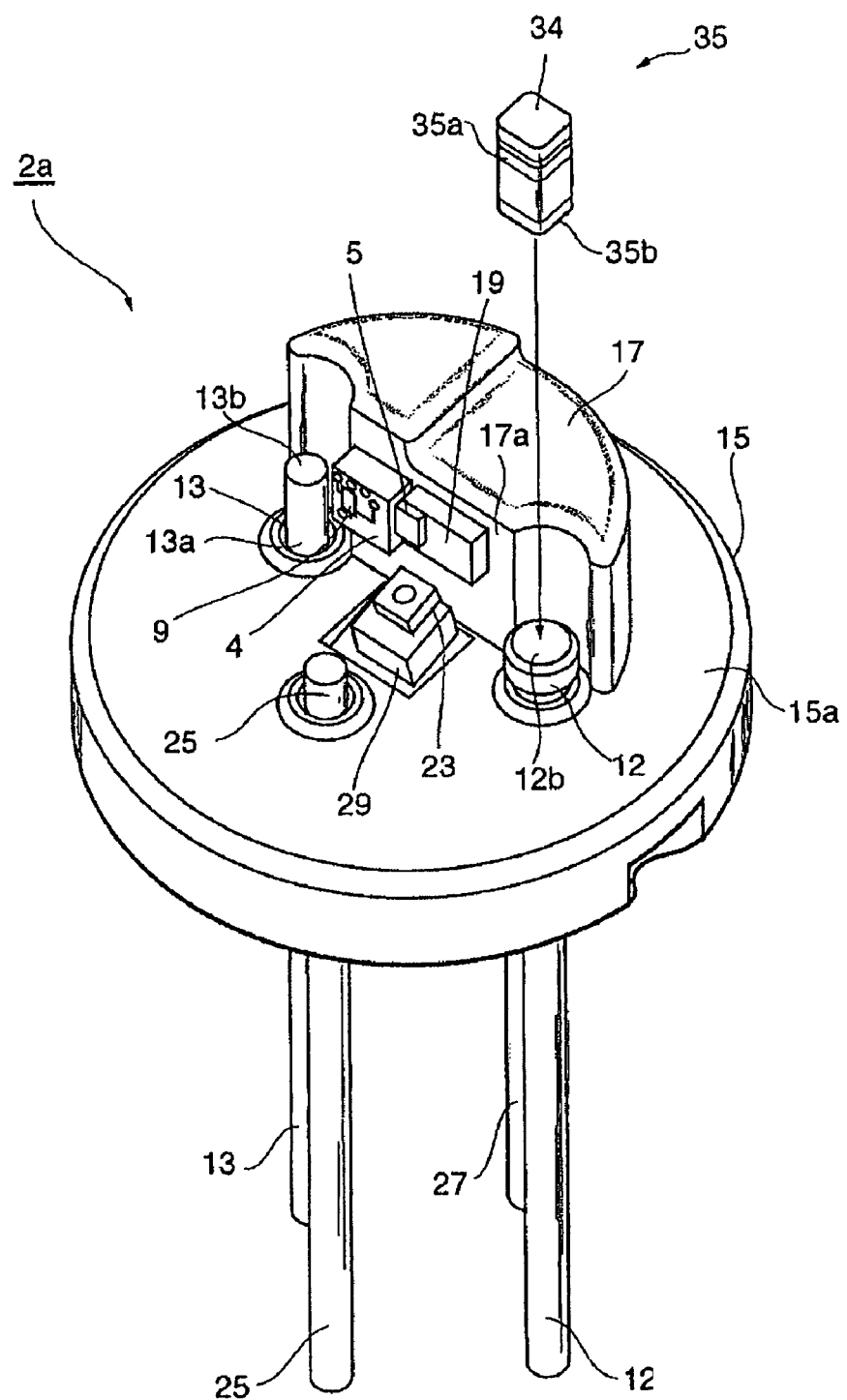
FIG. 7 is an exploded view of the optical transmitting module according to the third embodiment of the invention.

FIG. 4C shows still another circuit diagram of the light-transmitting module, and FIG. 6 and FIG. 7 are perspective views showing the present embodiment of the invention.

The light-transmitting module 2a further includes an inductor 35 having first and second electrodes 35a and 35b. The first electrode 35a is connected to the current terminals 9a of the transistor 9 and the electrode 5a of the light-emitting device 5. The second terminal 35b of the inductor 35 is connected to the lead 12. On the first electrode 35a of the inductor 35 is provided a metal slab 34, through which the electrode 35a is connected to the electrode 5a of the light-emitting device 5. In this embodiment, it is not necessary to secure a space on the base 15 or the side 17a of the block 17 to install the inductor 35.

As shown in FIG. 4C, the inductor 35 is interposed in a current path for supplying the bias current $I_B$ to both the light-emitting device 5 and the electronic device 4, whereby the degradation of the quality of the optical output caused by noise of the bias current source can be reduced. The inductor 35 may be a chip inductor that has dimensions and size preferable to be built in the light-transmitting module 2a.

Figure 8:
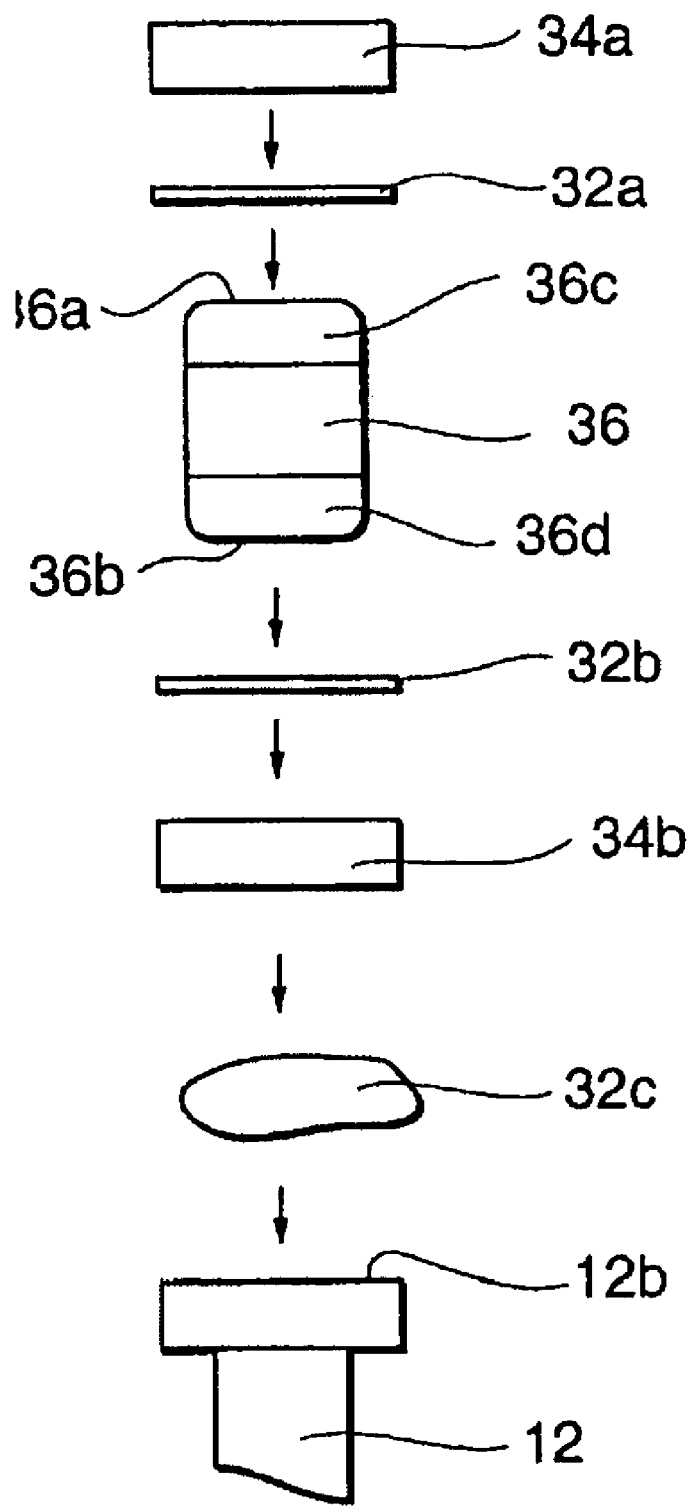
FIG. 8 shows an inductor assembly and a tip portion of the lead.

FIG. 8 shows a detail of the inductor 35, a chip inductor 36 in the present embodiment, and the lead where the inductor 35 is mounted thereon. The metal slab 34a is fixed to the end 36c of the inductor 36 with solder, for example, AuSn eutectic alloy. Another metal slab 34b is fixed to the other end 36b of the inductor also with AuSn eutectic alloy, and the inductor 36, with two metal slab 34a and 34b, is fixed to the side 12b of the lead 12.

The chip inductor 36 may be a ferrite bead inductor. Electrodes 36a and 36b of the ferrite bead inductor 36 are generally coated with tin (Sn), which is hard to carry out the wire bonding thereto. Therefore, The metal slabs 34a and 34b coated with gold (Au) are attached to respective electrodes 36a and 36b with AuSn pellets 32a and 32b. AuSn eutectic metal is preferable to use within the air-tightly sealed package because it shows an excellent wettability to tin and gold without any flux. To provide the metal slab 34a and 34b on respective electrodes 36a and 36b enable to carry out the wire bonding. Further, a conductive resin, which generally contains silver (Ag) as a conductive material, fixes the assembly of the chip inductor 36 and the metal slab 34 to the lead 12. Since the metal slabs 34a and 34b lie between the chip inductor 36 and the conductive resin, silver contained in the resin and tin contained in the electrodes may not react, whereby the deterioration in the bonding strength and the increase of the contact resistance may not occur.

The dimension of the ferrite bead inductor 36 is, for example, 1.0×0.5×0.5 (mm$^3$). The metal slab 34 is formed, for example, by etching of Kovar, which is an alloy of nickel (Ni), iron (Fe) and cobalt (Co). The dimension of the metal slab 34 is, for example, 0.6×0.6×0.2 (mm$^3$). The ferrite bead inductor can provide large inductance with small dimensions such that an inductor having inductance of one micro henry may be installed within the light-transmitting module. Japanese patent published as 2002-374028 has disclosed that an inductor formed on the insulating substrate with a wiring pattern. However, in the case of an inductor capable of being installed within the CAN type package, only an inductor with a few nano-henry at most can be obtained, which is not enough for compensating the degradation of the transmission quality of the signal input to the module 2a.

The chip inductor 35 is mounted on an edge plane 12b of the lead 12, which intersects the optical axis Aop of the light-emitting device 5. Since the inductor 35 is directly mounted on the lead 12, parasitic capacitance formed between the inductor 35 and other conductive material can be reduced.

(Fourth Embodiment)

Figure 9:
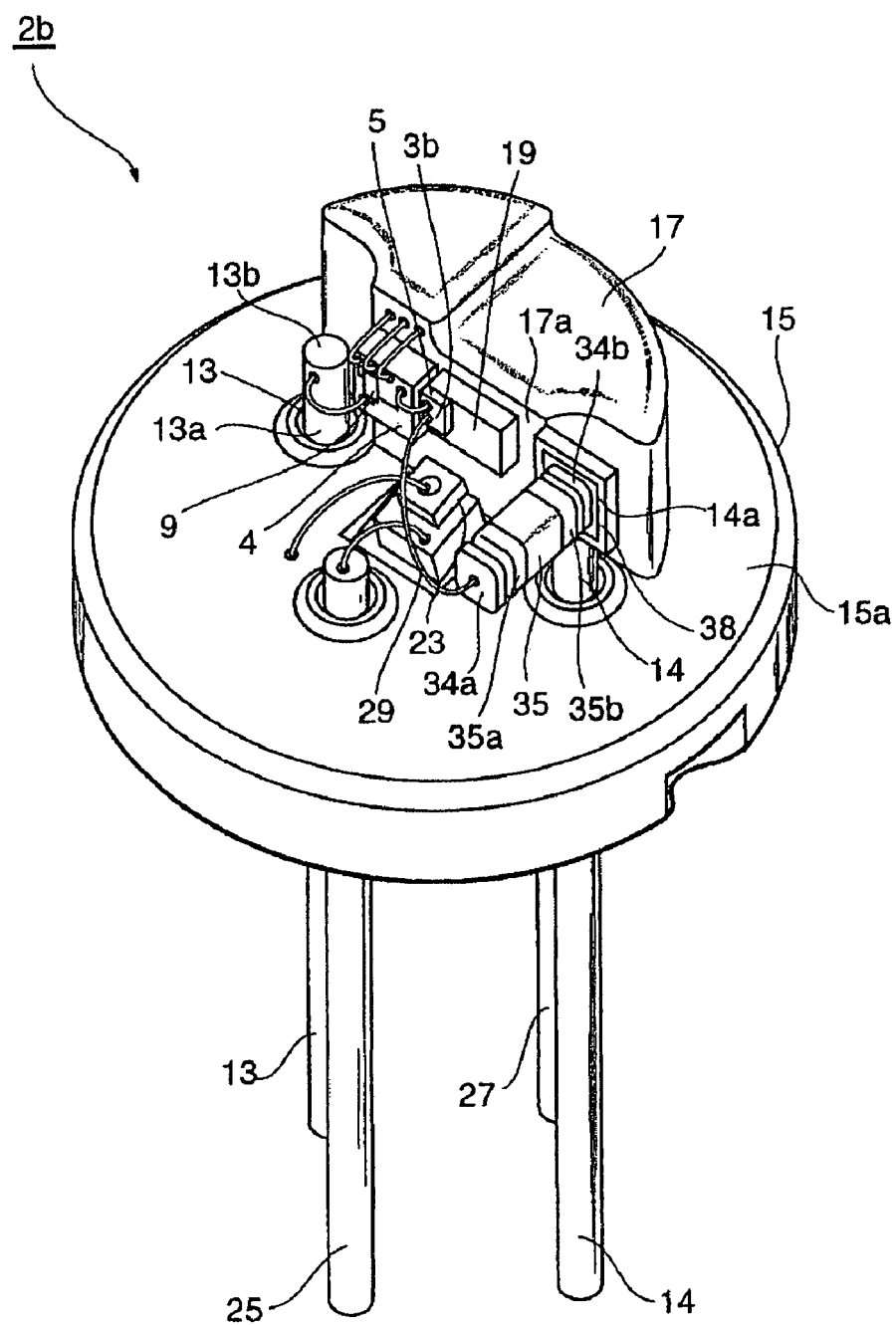
FIG. 9 is a perspective view showing the optical transmitting module according to the fourth embodiment of the invention.
Figure 10:
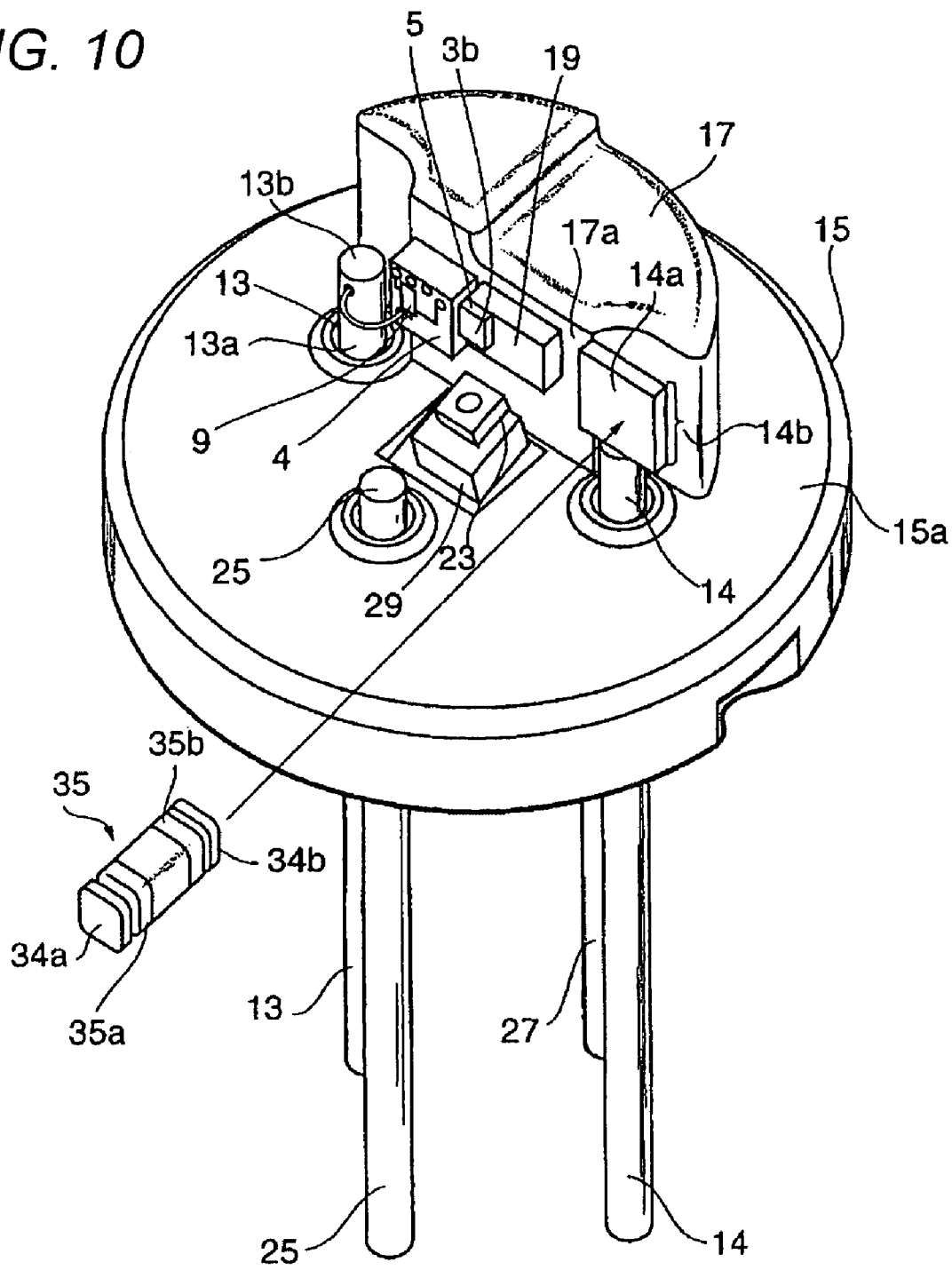
FIG. 10 is an exploded view showing the fourth embodiment of the invention.

FIG. 9 and FIG. 10 show another embodiment of the present invention, which also includes an inductor 35 similar to the previous embodiment shown in FIG. 6 and FIG. 7. The circuit diagram of the module and the function of the inductor 35 are same as those described in the previous embodiment.

In the present embodiment, the inductance 35 is mounted on the side plane 14a, which intersects the base 15, of the lead 14 with conductive resin 38. These light-transmitting modules 2a and 2b provide electronic device 4 that includes the resistor 31. However, another electronic device 3 provided in the first embodiment shown in FIG. 1 may be applied to those light-transmitting modules 2a and 2b.

(Fifth Embodiment)

Figure 11:
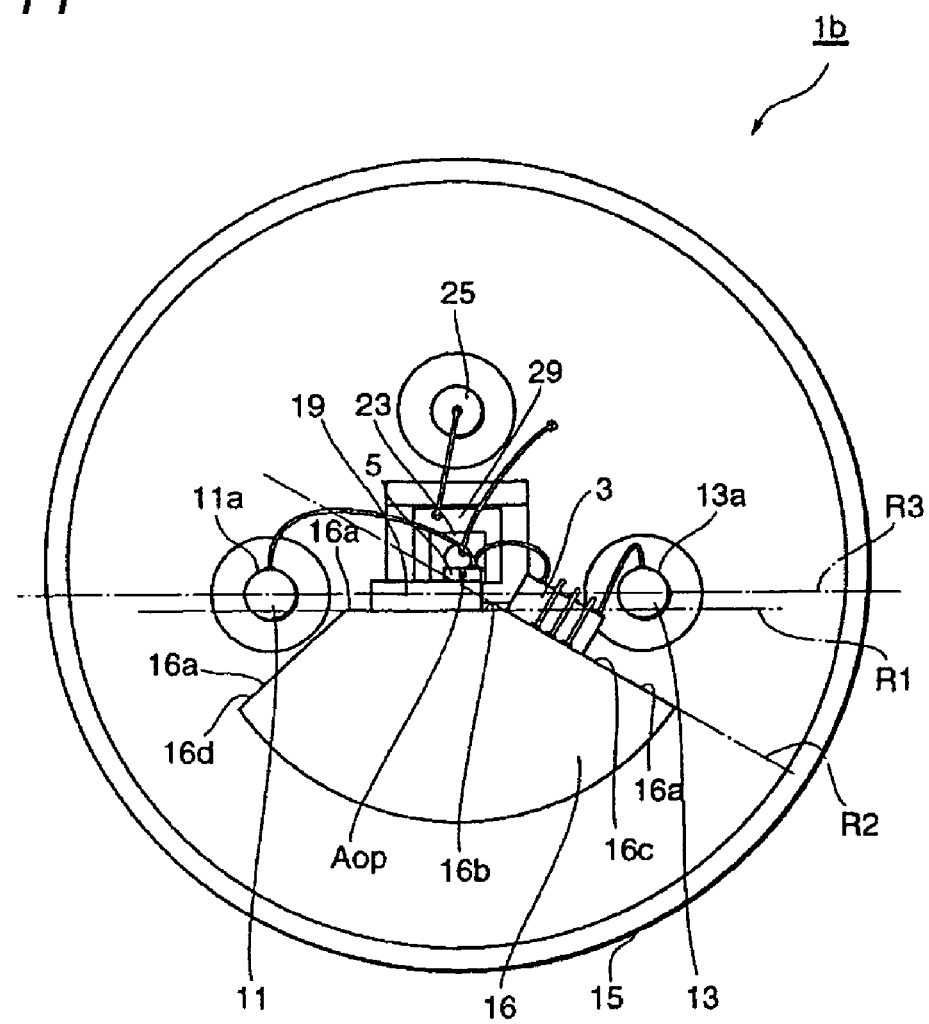
FIG. 11 is plan view showing the fourth embodiment of the invention.

FIG. 11 is a plan view showing another light-transmitting module 1b according to the present invention. The light-transmitting module 1b includes a modified block 16 instead of the block 17 in previous embodiments. The side 16a of the block 16 includes first and second sides, 16b and 16c, respectively, which make an angle with respect to each other. The CAN type package has restricted areas where the electronic and optical devices are to be mounted thereon. However, in this embodiment, two areas 16b and 16c are provided on the side of the block 16, which substantially expands the area for the device mounting.

The shape of the block 16 is defined such that two leads 11 and 13 may be positioned on the imaginary plane R1, namely, positions of three lead 11, 13 and 25 makes a triangle, and the line connecting leads 11 and 13 passes the center of the base 15. In order to realize this arrangement for three leads, the block 16 has a shape including three sides, 16b, 16c, and 16d. The side 16b, parallel to the line connecting leads 11 and 13, and mounts the light-emitting device thereon. The side 16c, the electronic device 3 is mounted thereon, makes an angle to the side 16b to provide a space for the lead 13. The side 16d makes another angle to the side 16b to provide a space for the lead 11.

Since the present module 1b has a block 16 including a plurality of sides each making angles to provide areas for the leads, it is not necessary to form depressions provided in the block 17, as shown in FIG. 1, thereby simplifying the process to form the block 16. Moreover, even such block provided in the present embodiment enables to mount the light-emitting device 5 and the electronic device 3 immediately close to each other, accordingly, both devices can be connected with short bonding wires.

(Sixth Embodiment)

From FIG. 12 to FIG. 15 show manufacturing process of the light-transmitting module according to the first embodiment shown in FIG. 1.

Figure 12:
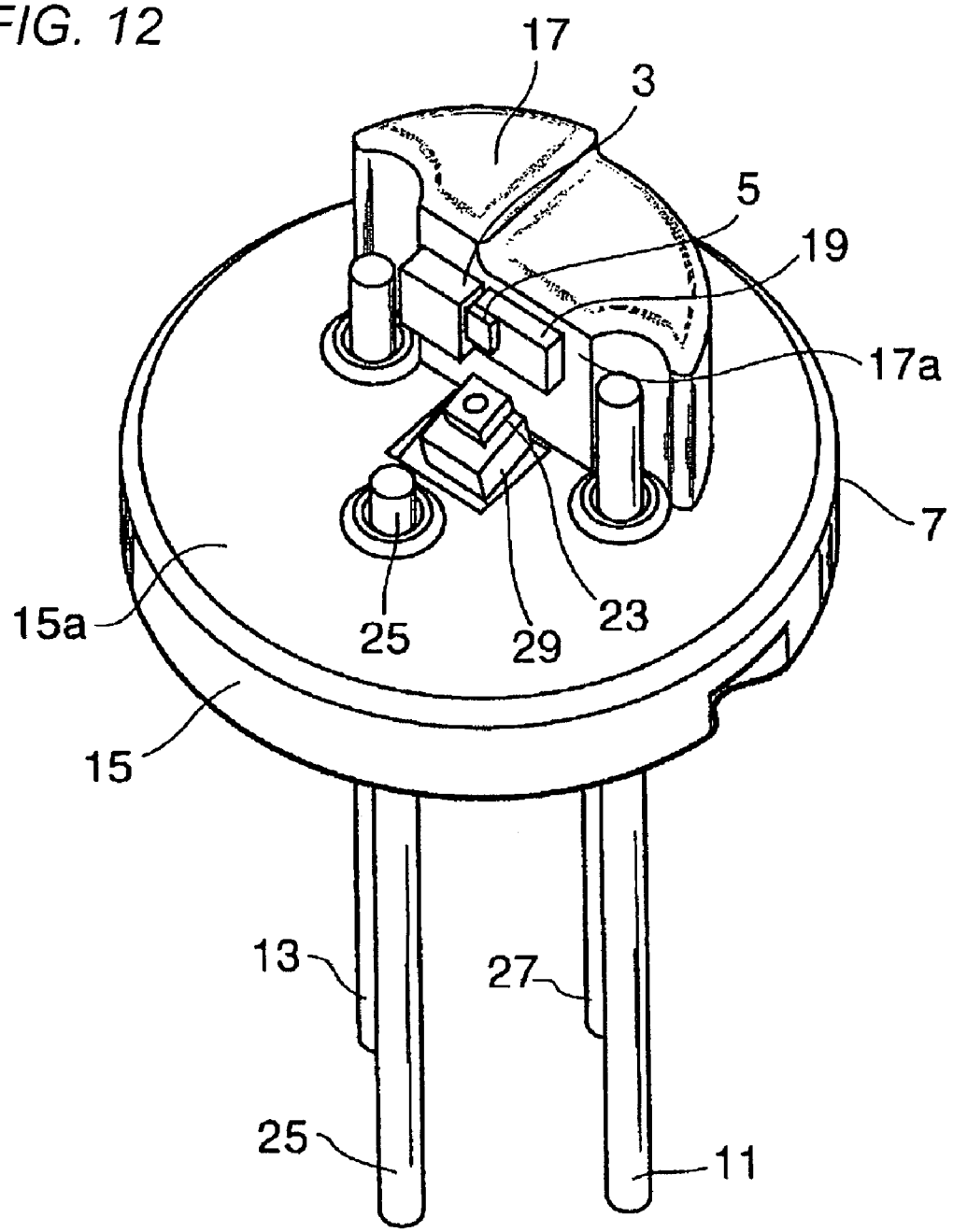

First, the electronic device 3, the light-emitting device 5, the light-receiving device 23, and the stem 7 are prepared. As shown in FIG. 12, the electronic device 3 and the light-emitting device 5 are mounted on the side of the block 17. The light-emitting device 5 is mounted through the heat sink 19. The light-receiving device 23 with the sub-mount thereunder is mounted on the base 15.

Figure 13:
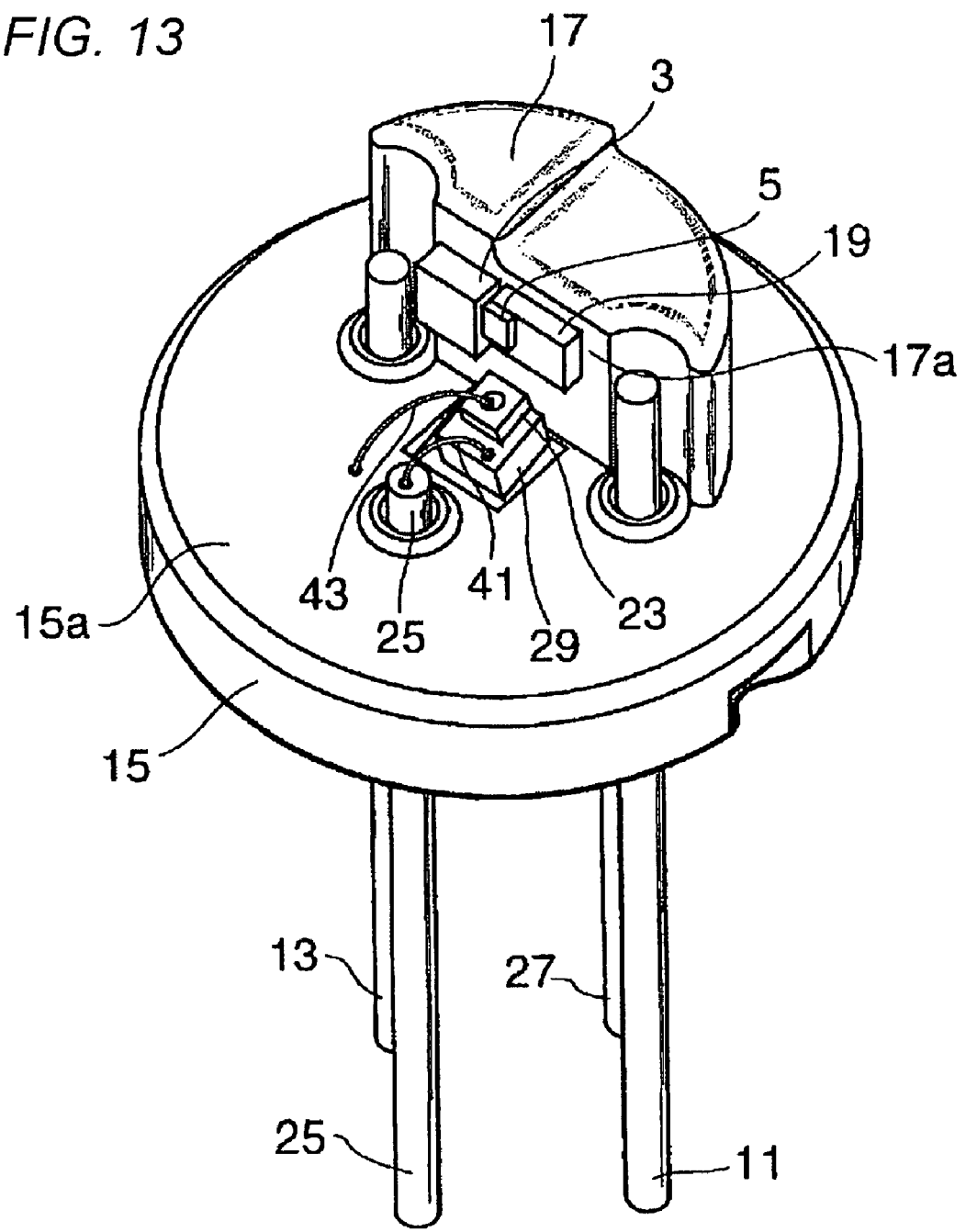

Next, as shown in FIG. 13, the cathode of the light-receiving device 23 is connected to the lead 25 with a bonding-wire 41, while the other electrode, the anode, of the light-receiving device is directly connected to the base 15 with another bonding-wire 43. The highest level of the bonding wires 41 and 43 are lower than the lower edge of the light-emitting device 5.

Figure 14:
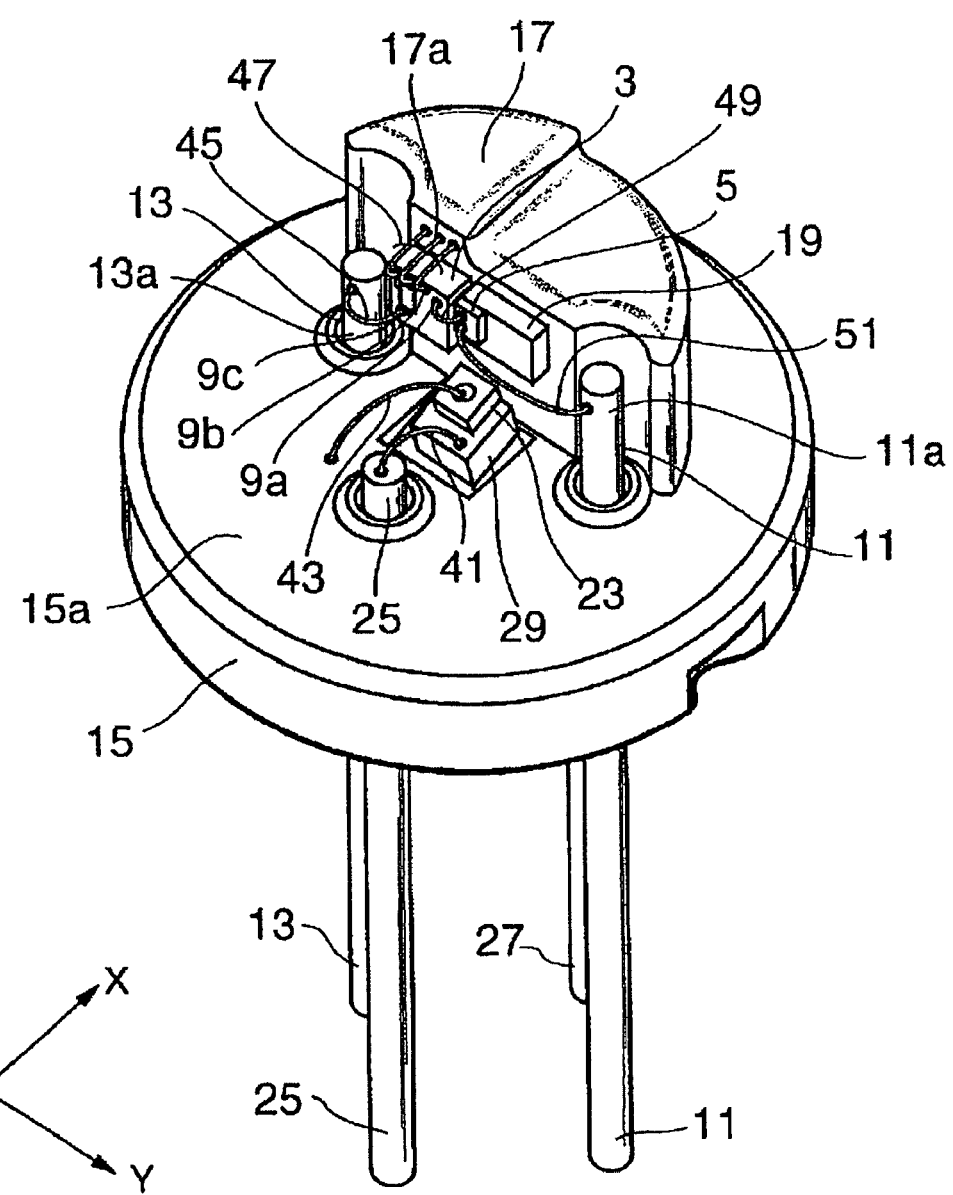
Figure 15:
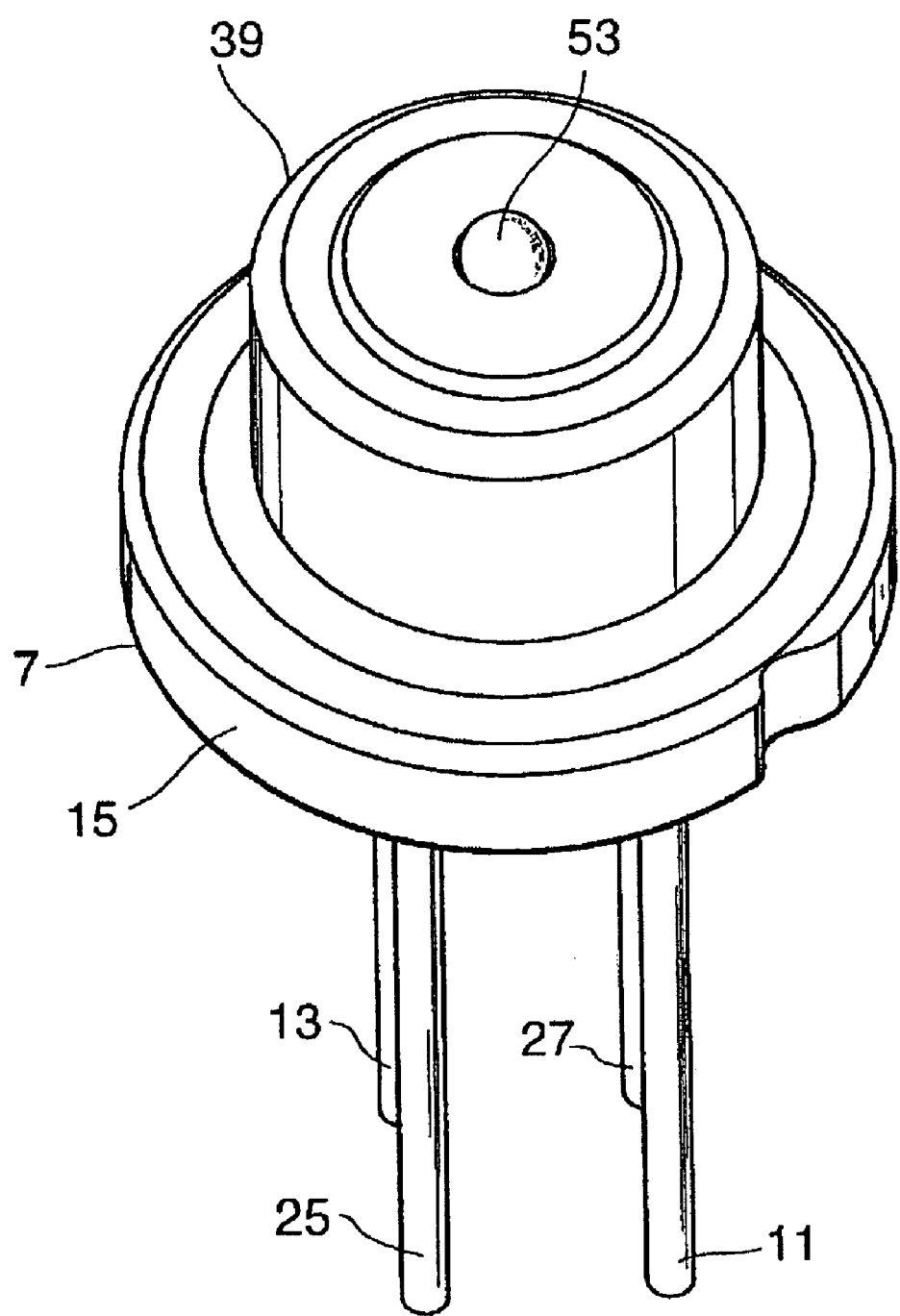

Subsequently, as shown in FIG. 14, the electronic device 3 and the light-emitting device 5 are connected to respective leads 11 and 13. Both devices are mounted on the side of the block 17 and between two leads 11 and 13, the electronic device 3 is close to the lead 13, while the light-emitting device 5 is close to the other lead 11.

A electrode, the control terminal 9c of the transistor 9, is connected to the side 13a of the lead 13 with a bonding-wire 45, while the other electrode, one of current terminals 9b of the transistor 9, of the electronic device 3, is connected to the side 17a of the block 17. The last electrode, the other of current terminals 9a of the transistor, of the electronic device 3 is connected to the light-emitting device 5 with a bonding-wire 49, and this electrode of the light-emitting device 5 is connected to the side 11a of the lead 11 with a bonding-wire 51. The lead 11 and the light-emitting device 5 may be electrically connected via the current terminal 9a and the bonding-wire 49. In this case, the lead 11 and the terminal 9a are connected by the other bonding-wire instead of the bonding-wire 51.

After completing the wire-bonding, a cap 39 is placed on and welded to the stem 7, which forms a cavity every devices 3, 5, and 23 sealed therein. The cap may provide a lens on top thereof The light emitted from the light-emitting device in the cavity is focused and is output to the outside of the module.

In a conventional light-transmitting module, the light-emitting device is installed in a metal CAN type package, and driven by the driver circuit provided outside of the metal package by supplying a driving current therefrom. Increasing the supply current may enhance the response for the high frequency signal. For the frequency over 10 GHz, for example, the supply current reaches 50 mA, or more. Such large current, moreover repeating on and off state, may cause an electromagnetic induced noise.

On the other hand in the present invention, the large current to modulate the light-emitting device flows only within the metal CAN type package. The signal to modulate the light-emitting device is applied to the module as a voltage signal with a magnitude as small as 0.5V. When setting the impedance of the termination to be 50 Ω, then the current applied thereto is only 10 mA. Since the electromagnetic induced noise depends on the magnitude of the current switched, the noise due to the driving signal applied to the module is intrinsically small. Moreover, even the current switching within the module is large and induces large electromagnetic noise, the metal package may reduce such induced noise from leaking outside of the module.

What is claimed is:

1. A light-transmitting module, comprising:
    a light-emitting device;
    an electronic device for driving said light-emitting device, said electronic device including a pair of current terminals and a control terminal for controlling a current flowing between said pair of current terminals, said light-emitting device being connected between said pair of current terminals of said electronic device; and
    a CAN type package for enclosing said light-emitting device and said electronic device therein, said CAN type package including a block having a side for mounting said light-emitting device and said electronic device thereon such that said light-emitting device is substantially positioned in a center of said CAN type package.

2. The light-transmitting module according to claim 1, wherein said electronic device is a field effect transistor having a drain terminal, a source terminal, and a gate terminal, said light-emitting device being connected between said drain and source terminals.

3. The light-transmitting module according to claim 1, wherein said electronic device is a bipolar transistor having a collector terminal, an emitter terminal, and a base terminal, said light-emitting device being connected between said collector and emitter terminals.

4. The light-transmitting module according to claim 1, further includes a resistor connected between said control terminal and one of said current terminals.

5. The light-transmitting module according to claim 1, wherein
    said CAN type package further includes a base for supporting a plurality of leads, said block being provided on said base, said control terminal of said electronic device being connected to one of said plurality of leads, one of said current terminal of said electronic device being directly connected to said block, and the other of said current terminal of said electronic device and one electrode of said light-emitting device being electrically connected to the other of said plurality of said leads.

6. The light-transmitting module according to claim 5, wherein said side of said block includes a first region for mounting said light-emitting device and a second region for mounting said electronic device, said first region having a first level measured from said base and said second region having a second level measured from said base, said second level being greater than said first level, and
    wherein said one of said current terminal of said electronic device being directly connected to said second region sticking out of said first region.

7. The light-transmitting module according to claim 5, wherein said side of said block includes a first region, a second region for mounting said electronic device, and a third region, said first region mounting said light-emitting device thereon such that said light-emitting device is substantially positioned in a center of said base, said second region and said third region sandwiching said first region therebetween such that said second region and said third region make respective angles to said first region to bare said plurality of said leads from said base.

8. The light-transmitting module according to claim 5, further includes a light-receiving device provided on said base for monitoring light emitted from said light-emitting device.

9. The light-transmitting module according to claim 5, further includes an inductor provided between the other of said lead, and said electrode of said light-emitting device and the other of said current terminals of said electronic device.

10. The light-transmitting module according to claim 9, wherein said inductor includes a metal slab coated with gold, said inductor being fixed to said the other of said lead through said metal slab.

11. The light-transmitting module according to claim 9, wherein said inductor includes a metal slab coated with gold on one electrode thereof, said electrode of said light-emitting device and the other of said current terminals of said electronic device being wire-bonded to said metal slab on said electrode of said inductor.

12. An optical transmitting module, comprising: a semiconductor laser diode having an anode and a cathode;
    a transistor having a pair of current terminals and a control terminal for controlling a current flowing between said pair of current terminals, said anode and said cathode of said laser diode being connected to respective current terminals of said transistor such that said laser diode is driven by a shunting-configuration; and
    a CAN type package having a disk shaped base, a metal block provided on said base, and a plurality of leads provided on said base,
    wherein said metal block has a side for mounting said laser diode and said transistor such that said semiconductor laser diode is substantially positioned in a center of said base.

13. The optical transmitting module according to claim 12,
    wherein said side of said block includes a first region for mounting said laser diode such that said cathode of said laser diode faces and directly contacts thereto, and a second region for mounting said transistor, and
    wherein said control terminal of said transistor being connected to one leads, one of said current terminal of said transistor being wire-bonded to said second region of said block, and the other of current terminals and said anode of said laser diode being electrically connected to the other leads.

14. The optical transmitting module according to claim 13, wherein said first and second regions of said side of said block are within a same plane.

15. The optical transmitting module according to claim 13, wherein said first and second regions make an angle.

16. The optical transmitting module according to claim 13, further comprises an inductor connecting said other current terminal of said transistor and said anode of said laser diode to said other lead.

17. The optical transmitting module according to claim 16, wherein said inductor is mounted on a side of said other lead.

18. The optical transmitting module according to claim 16, wherein said inductor is mounted on a top of said other lead.

19. The optical transmitting module according to claim 13, further includes a resistor connecting said control terminal of said transistor to said one of said current terminal of said transistor.

* * * * *